April 21, 1964 C. R. COOK, JR 3,130,378

RELAXATION OSCILLATOR UTILIZING FIELD-EFFECT DEVICE

Filed May 2, 1960

2 Sheets-Sheet 1

INVENTOR
Charles R. Cook, Jr.

BY Stevens, Davis, Miller & Mosher
ATTORNEYS

INVENTOR.
Charles R. Cook, Jr.
BY
Stevens, Davis, Miller & Mosher
ATTORNEYS 3,130,378

RELAXATION OSCILLATOR UTILIZING FIELD-EFFECT DEVICE

Charles R. Cook, Jr., Richardson, Tex., assignor to Texas Instruments Incorporated, Dallas, Tex., a corporation of Delaware Filed May 2, 1960, Ser. No. 26,133
6 Claims. (Cl. 331—111)

This invention relates to an improved semiconductor relaxation oscillator and more particularly to a relaxation oscillator making use of the switching properties of a bipolar field-effect transistor.

The advantages of semiconductor circuits involving reduced power consumption, reduced weight, and reduced size are well known. However, semiconductor circuits generally have problems of temperature stability, and the semiconductor relaxation oscillator circuits of the prior art are no exception. The semiconductor relaxation oscillator of the present invention does not have the problem of temperature stability because the frequency of oscillation depends upon the pinch-off voltage of a field-effect transistor, and the pinch-off voltage of a field-effect transistor is independent of temperature.

Furthermore, the relaxation oscillator circuit of the present invention will generate higher frequencies and produce better pulse sharpness than the circuits of the prior art which are of comparable simplicity.

In addition to these advantages, the circuit of the present invention provides a means to control the minority carrier storage in the device which improves the turn-off time of the circuit and the pulse shape provided by the circuit. Finally, the circuit of the present invention can be fabricated from a single semiconductor element, and thus the circuit can be fabricated quickly and easily.

Further objects and advantages of the present invention will become readily apparent as the following detailed description of the invention unfolds and when taken in conjunction with the drawings wherein:

FIGURE 1 shows a unipolar field-effect transistor;

FIGURE 2*a* illustrates the bipolar field-effect transistor of the type used in the present invention;

FIGURES 2*b* and 2*c* show the top and cross sectional views of the bipolar field-effect transistor having a preferred structure;

Figure 1:
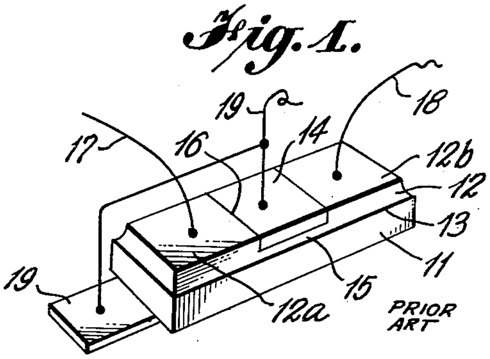

The present invention makes use of a bipolar field-effect transistor which is a modification of a unipolar field-effect transistor such as that illustrated in FIGURE 1. The unipolar field-effect transistor in FIGURE 1 comprises a block 11 of N-type material on which there is a diffused layer 12 of P-type material forming a PN junction 13 with the N-type material of the block 11. In the middle of the layer 12 of P-type material is a diffused section 14 of N-type material which extends down into the layer 12 of P-type material, dividing it into two main parts **12*a* and 12*b* connected by a narrow conducting channel 15 of P-type material bounded by the N-type material of block 11 and the section 14 of N-type material. The section 14 of N-type material makes a PN junction 16 with the layer 12 of P-type material. An ohmic connection is made to one of the main parts 12*a* of the layer 12 of P-type material. This connection provides the source 17 of the field-effect transistor. An ohmic connection is made to the other main part 12*b* of the layer 12 of P-type material to provide the drain 18 of the field-effect transistor. Ohmic connections are also made to the section 14 and to the block 11 on the side opposite to the layer 12, which connections are connected together to form the gate 19** of the field-effect transistor.

The width of the channel 15 between the boundaries provided by the PN junctions 13 and 16 is important in determining the characteristics of the field-effect transistor. This width is controlled and determined by the depths of diffusion of the layer 12 and the section 14. With this structure, the conductance in the channel 15 of P-type material between the source 17 and the drain 18 is controlled by the voltage applied to the gate 19.

Figure 2A:
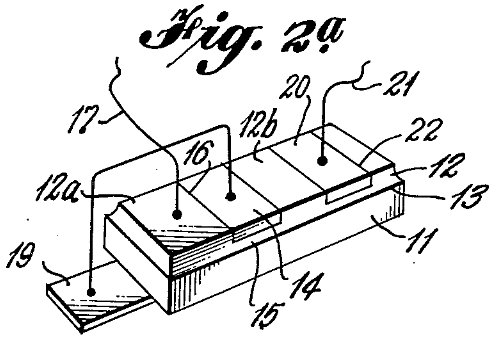
Figures 3, 4:
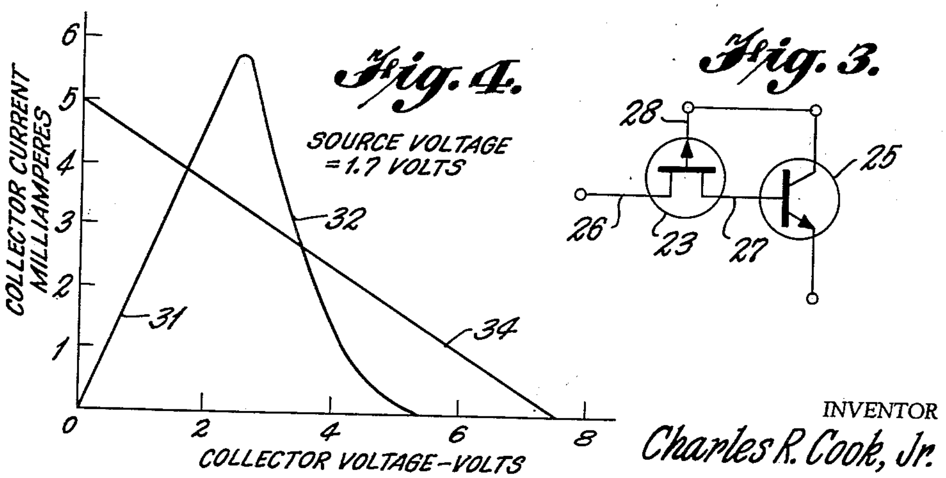
FIGURE 3 shows the equivalent circuit of the bipolar field-effect transistor.
FIGURE 4 shows a characteristic of the bipolar field-effect transistor.

FIGURE 2*a* illustrates a bipolar field-effect transistor of the type which is used in the circuit of the present invention. As shown in FIGURE 2*a*, the bipolar field-effect transistor, like the unipolar field-effect transistor illustrated in FIGURE 1, comprises a block 11 of N-type material on which there is a diffused layer 12 of P-type material. In the layer 12 is a diffused section 14 of N-type material. The N-type material of the block 11 forms a PN junction 13 with the layer 12 of P-type material. The section 14 of N-type material also forms a PN junction 16 with the layer 12 of P-type material. As in the unipolar transistor, the section 14 extends into the layer 12, dividing it into two major parts **12*a* and 12*b* connected by a narrow channel 15 of P-type material. An ohmic contact is made with the part 12*a* of the layer 12 to form the source 17 of the bipolar field-effect transistor. Ohmic contacts are made to the section 14 and to the block 11 on the side opposite the layer 12, which contacts are connected together to form an electrode 19 of the bipolar field-effect transistor. The electrode 19 in the bipolar field-effect transistor is structurally the same as the gate 19** in the unipolar field-effect transistor. In the bipolar field-effect transistor, however, this electrode is referred to as the collector. As can be seen in FIGURE 2*a*, the bipolar field-effect transistor differs from the unipolar field-effect transistor in that a diffused section 20 of N-type material is provided in the part **12*b* of the layer 12 of P-type material. This section 20 of N-type material extends down into the layer 12 of P-type material not quite as far as the junction 13. An ohmic contact is made to the section 20 forming the emitter 21 of the bipolar field-effect transistor. The section 20 forms a PN junction 22 with the P-type material of the layer 12. The PN junctions 22 and 13** will coact to provide junction transistor action and, as a result, the bipolar field-effect transistor will function as a junction transistor and unipolar field-effect transistor connected together in a circuit, which is shown in FIGURE 3.

Figure 2C:
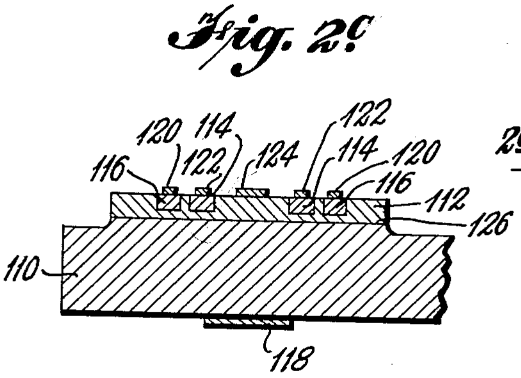
Figure 2B:
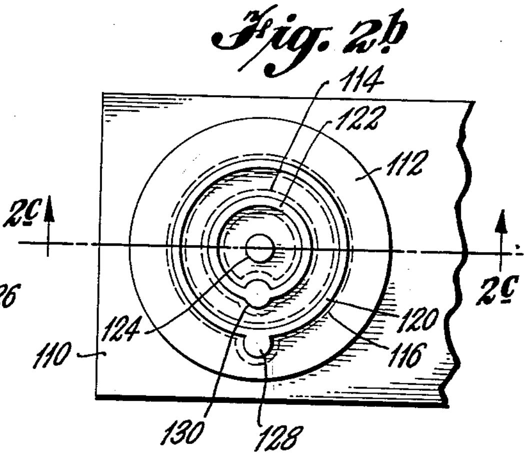

FIGURES 2*b* and 2*c* show a particular physical embodiment of the bipolar field-effect transistor of FIGURE 2*a* which has been found to be especially desirable, and which is used in the preferred embodiment of the invention. A specific example of a method of producing this structure will now be described. A wafer 110 of silicon of a resistivity of 7.5 ohm-centimeters is used as the starting material. Each side of the wafer is lapped to achieve wafer thickness of 10 mils. The upper side of the wafer is then optically polished. After the polishing operation, the wafer is placed in an open tube, and steam of a temperature of approximately 1200° C. is allowed to pass over the wafer. This operation causes a thin oxide film to form on all surfaces of the wafer. The wafer is then subjected to diffusion from a gallium trioxide source in the presence of dry oxygen to form a layer of P-type material approximately 0.7 mils thick in the surface of the wafer. Using photoresist techniques, the oxide film is then selectively removed from concentric circular portions of the wafer surface. After the selective removal of the oxide film, the wafer is subjected to a second diffusion cycle in which phosphorus is diffused to a depth of approximately 0.3 mil from a phosphorus pentoxide source in the presence of dry nitrogen. The resulting thin layer of P-type material is then removed from the bottom and sides of the wafer, leaving a layer 112 of P-type material on the surface of the wafer, making a PN junction 126 with the N-type material of the wafer. The second step of diffusion from the source of phosphorus pentoxide causes concentric circular sections 114 and 116 of N-type material to be formed in the layer 112 making PN junctions with the P-type material of the layer 112. Ohmic contacts 120 and 122 to the sections 116 and 114, respectively, are provided. An ohmic contact 124 to the layer 112 is provided at the center about which the circular sections 114 and 116 are positioned. An ohmic contact 118 is provided to the bottom of the wafer 110. The contacts 118, 120, 122, and 124 are of aluminum, and are formed by evaporation and sintering techniques. The wafer is then masked with an etch-resistant material such as wax, and the wafer etched in an acid solution to achieve the mesa configuration shown in FIGURE 2*c*.

The resulting device is a bipolar field-effect transistor which is equivalent to the device in FIGURE 2*a*. In the device in FIGURES 2*b* and 2*c*, the contacts 124 and 120 correspond to the source 17 and the emitter 21, respectively, in FIGURE 2*a*. The contacts 122 and 118 in FIGURES 2*b* and 2*c* will be connected together and correspond to the collector 19 in FIGURE 2*a*. The sections 114 and 116 in FIGURES 2*b* and 2*c* correspond to the sections 14 and 20, respectively, in FIGURE 2*a*.

It is to be noted that, in some instances, it may be desirable that the sections 114 and 116 be diffused to different depths or have different impurity concentrations therein. In such instances, it will be necessary to form the sections by different diffusion cycles. In the preferred embodiment, however, only one diffusion cycle is used to form both sections 114 and 116.

The circuit in FIGURE 3 is the equivalent circuit of the bipolar field-effect transistor. As shown in FIGURE 3, the equivalent circuit comprises a unipolar field-effect transistor 23 and a junction transistor 25, which in the specific embodiment of the present invention is an NPN transistor. In FIGURE 3, the source of the unipolar field-effect transistor 23 is designated by the reference number 26, the gate by the reference number 28, and the drain by the reference number 27. The unipolar field-effect transistor 23 has its drain connected directly to the base of the junction transistor 25. The gate of the field-effect transistor 23 is connected directly to the collector of the junction transistor 25. The source of the bipolar field-effect transistor corresponds in its equivalent circuit to the source 26 of the unipolar field-effect transistor 23. The collector of the bipolar field-effect transistor corresponds in its equivalent circuit to the common connection between the gate 28 of the unipolar field-effect transistor 23 and the collector of the junction transistor 25. The emitter of the bipolar field-effect transistor corresponds in its equivalent circuit to the emitter of the junction transistor 25.

A collector voltage versus colletcor current characteristic for the bipolar field-effect transistor and for its equivalent circuit is shown in FIGURE 4. This characteristic is for a constant source voltage of 1.7 volts. This characteristic, as seen in FIGURE 4, has a positive resistance portion 31 and a negative resistance portion 32. The negative resistance portion of the characteristic arises when the junction transistor 25 is not in saturation. As the collector voltage rises, the voltage applied to the gate of the unipolar field-effect transistor 23 will rise, and this will decrease the drain current flowing from the field-effect transistor 23. In this manner, the base current flowing to the junction transistor 25 is decreased, and this decrease in base current will cause a decrease in the collector current. Thus, as the collector voltage is increased, the collector current of the transistor 25 will decrease, thus providing the negative resistance portion of the characteristic. The positive resistance portion of the characteristic occurs during the time that the junction transistor 25 is saturated. At low values of collector voltage, the drain current of the field-effect transistor 23 will be high, and thus the base current of the transistor 25 will be high enough to cause the transistor 25 to saturate. As the collector voltage is increased, it will decrease the current flowing from the drain of the field-effect transistor 23. However, since the transistor 25 is in saturation, this will have no effect on the collector current of the transistor 25. Therefore, the collector current will increase as the collector voltage increases, thus providing the positive resistance portion 31 of the characteristic shown in FIGURE 4. The point at which the characteristic changes from positive resistance to negative resistance is the point at which transistor 25 comes out of saturation.

From FIGURE 4, it will be seen that the device has bistable properties. For example, the 1500 ohm load line 34, drawn from the point represented by 5 milliamperes and zero volt to the point represented by zero milliampere and 7.5 volts, crosses the characteristic three times. One crossing is on the positive resistance portion 31 of the characteristic, another crossing is on the negative resistance portion 32, and the third crossing is on the cut-off line at a current of zero milliamperes. Therefore, two stable points are provided, one being on the positive resistance portion where the transistor 25 is in saturation, and the other being on the cut-off line where the field-effect transistor 23 is pinched off and the junction transistor 25 is cut off.

Figure 5:
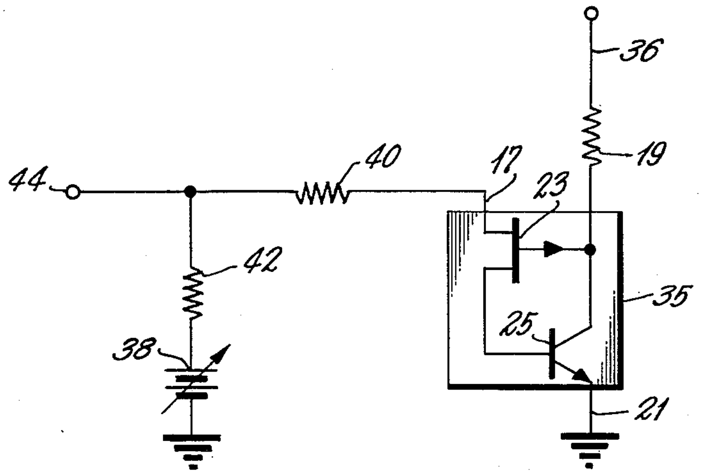
FIGURE 5 shows a bistable circuit exemplifying the switching properties of the bipolar field-effect transistor.

FIGURE 5 exemplifies the switching characteristics of the device. In FIGURE 5, the reference number 35 generally designates the bipolar field-effect transistor, in order to facilitate the description of the operation of the device, which is represented by its equivalent circuit comprising the unipolar field-effect transistor 23 and the junction transistor 25. In FIGURE 5, the emitter 21 of the bipolar field-effect transistor 35 is grounded and the collector 19 is connected to a source of positive voltage through a 300 ohm resistor 36. The source 17 of the bipolar field-effect transistor 35 is connected to the positive terminal of a variable voltage source 38 through the series circuit of a 2 kilohm resistor 40 and a 51 ohm resistor 42. The negative terminal of the source 38 is grounded. A terminal 44 is connected to the junction between resistors 40 and 42 to provide an input to the circuit.

If the circuit is in the condition in which the field-effect transistor is pinched off and the junction transistor is cut off, and a positive pulse is applied to the input 44, the voltage at the source 17 will rise at a rate depending on the RC time constant associated with the input resistor 40 and the capacitance from the source 17 to ground. When the voltage at the source 17 starts to rise, the gate-to-source voltage of the field-effect transistor 23 will decrease. When this gate-to-source voltage decreases to a value below the pinch-off voltage for the field-effect transistor 23, the field-effect transistor 23 will start to conduct. When the field-effect transistor starts to conduct, it will supply current to the base of the junction transistor 25. The base current flowing in the junction transistor 25 will start collector current to flow in the junction transistor 25 and the collector voltage of the junction transistor 25 will drop. As a result, the voltage at the gate of the field-effect transistor 23 drops, and more current flows through the field-effect transistor 23. The action is regenerative, and the field-effect transistor and the junction transistor are switched quickly to a fully conducting condition. If the field-effect transistor supplies enough current to the base of the junction transistor, it will saturate, the diode from the gate-to-source of the field-effect transistor 23 will become forward-biased, and the voltage at the source 17 will be clamped to the voltage at the collector 19. The device will remain fully conducting until the voltage at the source 17 is decreased to less than the voltage at the collector 19, at which time the field-effect transistor 23 will start to be pinched off. A regenerative action will come into play to switch the device to a nonconducting condition if the junction transistor acts faster than the field-effect transistor 23. Otherwise, the field-effect transistor will become nonconducting while the junction transistor is still in storage.

It should be noted that, when the junction transistor 25 is saturated, the voltage from the collector to the base of the junction transistor 25 is about zero volts; therefore, the voltage from the source to the drain of the field-effect transistor 23 will be the same approximately as the voltage from the source to the gate, and the field-effect transistor 23 will be in its saturation region. Therefore, the source-to-drain current of the field-effect transistor may be less than its limiting value. If the junction transistor 25 requires the limiting value of drain current as base current to saturate, it will never saturate, and the field-effect transistor 23 will act as a base current clamp to keep the junction transistor 25 out of saturation. Of course, the low-gain junction transistors are the ones that would not saturate. These low-gain devices would be the slowest switching to a fully conducting condition because there would be less loop gain, but they would be cut off faster because of decreased storage time.

The loop gain and the RC circuit of the input resistance 40 and the capacitance from the source 17 to ground determine the rise time of the circuit. The storage and fall time of the circuit depend almost entirely on the storage and fall time of the junction transistor 25.

Figure 6:
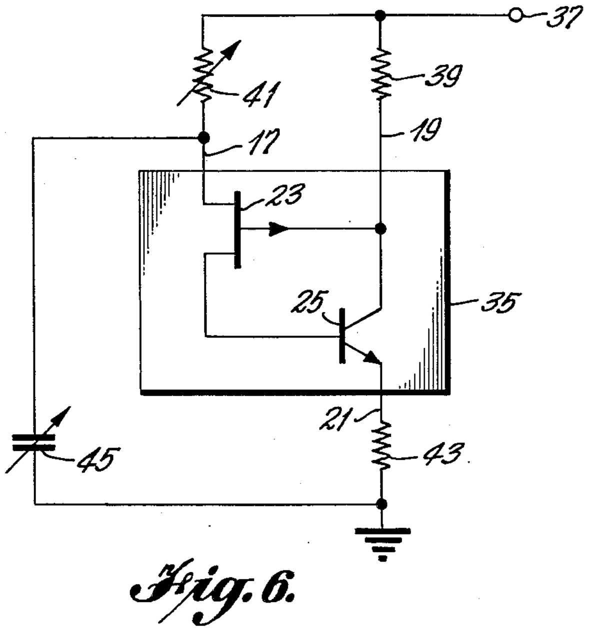
FIGURE 6 illustrates the relaxation oscillator circuit of the present invention.

FIGURE 6 illustrates how the bipolar field-effect transistor is connected in the relaxation oscillator of the present invention. In FIGURE 6, the reference number 35 generally designates the bipolar field-effect transistor. The bipolar field-effect transistor is represented as in FIGURE 5 by its equivalent circuit in order to facilitate the description of the operation. The collector 19 of the bipolar field-effect transistor 35 is connected to a source of +10 volts applied at a terminal 37 through a 200 ohm resistor 39. The +10 volts at terminal 37 is also connected through a variable 1 meg-ohm resistor 41 to the source 17 of the bipolar field-effect transistor 35. The emitter 21 of the bipolar field-effect transistor 35 is connected to ground through a 100 ohm resistor 43. A 0.022 microfarad capacitor 45 is connected between the source 17 of the field-effect transistor 35 and ground.

For purposes of the description of the operation, it is assumed that the capacitor 45 is discharged. The source 17 will therefore be at a low voltage, and as a result, the gate-to-source voltage of the unipolar field-effect transistor 23 will be high. Therefore, the field-effect transistor 23 will be pinched off, and will have no current flowing therethrough. As a result, no base current will flow through the junction transistor 25, and the transistor 25 will thus be cut off. Therefore, no collector current will flow in this transistor, and a high voltage will result at the collector of transistor 25. This high voltage will be applied to the gate of the transistor 23, maintaining it pinched off. Current will then flow from the positive source at terminal 37 through the variable resistor 41, charging the capacitor 45, thus causing the potential at the source 17 of the bipolar field-effect transistor 35 to rise. The capacitor 45 will charge in this manner until the voltage at the source 17 rises to a point at which the voltage between the gate and the source of the field-effect transistor 23 is below pinch-off. At this point, the field-effect transistor 23 will begin to conduct. When the field-effect transistor 23 starts to conduct, base current will start to flow in the transistor 25, thus causing collector current to flow in the transistor 25. This action will cause a drop in the collector voltage of the transistor 25 and in the gate voltage of the field-effect transistor 23. Therefore, current flow in the field-effect transistor 23 will increase. The action is regenerative, and the collector voltage of the transistor 25 will drop so far that the gate of the field-effect transistor 23 becomes forward-biased. When this happens, the capacitor 45 will discharge through the gate of the transistor 23 and into the collector of the transistor 25. Of course, some of the capacitor current will also go through the base of the transistor 25. The capacitor 45 will continue to discharge in this manner until the voltage at the source 17 drops to a point at which the current in the field-effect transistor starts to pinch off. When the field-effect transistor 23 starts to pinch off, it will reduce the base current flowing through the transistor 25, and thus cause the collector current of the transistor 25 to drop. The gate voltage of the field-effect transistor 23 will therefore rise. This action will further pinch off the current flowing in the field-effect transistor 23. The action is regenerative, and the transistors 23 and 25 will both stop conducting. The capacitor 45 will then again start to charge through the resistor 41, and the cycle will repeat itself ad infinitum.

The frequency of the circuit is determined by the size of the capacitor 45 and the resistor 41, since these two elements determine the charging current to the capacitor 45 and the voltage at the source 17. With the proper choice of values for the capacitor 45 and the resistor 41, the circuit can be made to oscillate at any frequency between 600 kilocycles per second and less than 1 cycle per second. The period and pulse width are directly proportional to the capacitance of the capacitor. The pulse width produced by the circuit can be decreased by decreasing the ratio of the resistance of the resistor 39 to that of the resistance of the resistor 41. By maintaining this ratio low, the transistor 25 is kept out of hard saturation and, therefore, it is easier to turn the transistor 25 off by the cumulative action.

Instead of using a bipolar field-effect transistor 35, the circuit can also be provided simply by using a unipolar field-effect transistor and a junction transistor connected in the circuit shown in FIGURE 5 as the field-effect transistor 23 and the junction transistor 25. When such a circuit is used, the pulse width generated by the circuit can be further decreased by providing a resistor connected from the base of the transistor 25 to ground. In this, there is provided a path directly to ground for the reverse base current of the transistor 25 which flows when the transistor 25 is cut off.

The term "bipolar field-effect transistor" used in the foregoing specification and appended claims means a unipolar (majority carrier) field-effect transistor and a junction or injection transistor (a minority carrier device) conected together as described.

The above description is of a preferred embodiment of the invention, and many modifications may be made thereto without departing from the spirit and scope of the invention which is limited only as defined in the appended claims.

What is claimed is:

1. A relaxation oscillator comprising a bipolar field-effect transistor having a source, a collector, and an emitter, a first conductor, a second conductor, a load resistor connected between said first conductor and the collector of said bipolar field-effect transistor, a second resistor connected between said first conductor and said source of said bipolar field-effect transistor, a capacitor connected between the source of said bipolar field-effect transistor and said second conductor, circuit means connecting the emitter of said bipolar field-effect transistor to said second conductor, and means to apply a potential between said first and second conductors.

2. A relaxation oscillator as recited in claim 1, wherein said second resistor and said capacitor are variable.

3. A relaxation oscillator as recited in claim 1, wherein said circuit means connecting the emitter of said bipolar field-effect transistor to said second conductor comprises a third resistor.

4. A relaxation oscillator comprising a junction transistor, a unipolar field-effect transistor, having its gate connected directly to the collector of said junction transistor and its drain connected directly to the base of said junction transistor, first and second conductors, means to apply potential between said first and second conductors, a load resistor connected between the collector of said junction transistor and said first conductor, a second resistor connected between said first conductor and the source of said unipolar field-effect transistor, and a capacitor connected between the source of said unipolar field-effect transistor and said second conductor, and circuit means connecting the emitter of said junction transistor to said second conductor.

5. A relaxation oscillator comprising a bipolar field-effect transistor having a source, a collector and an emitter, a voltage source and load impedance means connected in series between said collector and said emitter, a resistor and a capacitor connected in series across said voltage source, the juncture of said resistor and capacitor being connected to said source.

6. A relaxation oscillator comprising a wafer of single crystal semiconductor material, a first region of one conductivity-type defined in said wafer, a second region of the opposite conductivity-type defined in said wafer adjacent the surface thereof and contiguous to said first region, a third region and a fourth region of said one conductivity-type defined in said wafer adjacent the surface thereof and contiguous to said second region, said third and fourth regions being spaced from said first region and from one another, conductive means connecting said third region to said first region, a load impedance and a voltage supply connected in series between said first region and said fourth region, a resistor and a capacitor connected in series across said voltage supply, and means connecting the juncture of said resistor and capacitor to said second region.

References Cited in the file of this patent

UNITED STATES PATENTS

| | | |
|---|---|---|
| 2,193,868 | Geiger | Mar. 19, 1940 |
| 2,648,805 | Spenke et al. | Aug. 11, 1953 |
| 2,663,800 | Herzog | Dec. 22, 1953 |
| 2,829,257 | Root | Apr. 1, 1958 |
| 2,897,295 | Zelinka | July 28, 1959 |